(12) United States Patent
Kamikoriyama et al.

(10) Patent No.: US 8,486,306 B2
(45) Date of Patent: Jul. 16, 2013

(54) NICKEL INK AND CONDUCTOR FILM FORMED OF NICKEL INK

(75) Inventors: Yoichi Kamikoriyama, Ageo (JP); Hiroki Sawamoto, Ageo (JP); Mikimasa Horiuchi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 598 days.

(21) Appl. No.: 12/092,584

(22) PCT Filed: Oct. 27, 2006

(86) PCT No.: PCT/JP2006/321543
§ 371 (c)(1),
(2), (4) Date: May 5, 2008

(87) PCT Pub. No.: WO2007/052564
PCT Pub. Date: May 10, 2007

(65) Prior Publication Data
US 2009/0252924 A1 Oct. 8, 2009

(30) Foreign Application Priority Data

Nov. 4, 2005 (JP) ................................. 2005-321423
Sep. 7, 2006 (JP) ................................. 2006-242793

(51) Int. Cl.
*H01B 1/22* (2006.01)

(52) U.S. Cl.
USPC ........ 252/513; 252/512; 252/514; 252/520.2; 438/584; 438/597; 427/96.1; 427/96.4

(58) Field of Classification Search
USPC ............... 252/512–514, 520.2; 438/584, 597; 427/96.1, 96.4
See application file for complete search history.

(56) References Cited

U.S. PATENT DOCUMENTS

| 2005/0069648 A1* | 3/2005 | Maruyama ................. 427/379 |
| 2005/0173680 A1 | 8/2005 | Yang |
| 2005/0189520 A1* | 9/2005 | Okada et al. ................. 252/500 |
| 2005/0214480 A1 | 9/2005 | Garber et al. |
| 2005/0215689 A1 | 9/2005 | Garber et al. |
| 2005/0238804 A1 | 10/2005 | Garber et al. |
| 2006/0189113 A1* | 8/2006 | Vanheusden et al. ......... 438/597 |
| 2008/0187651 A1* | 8/2008 | Lee et al. .................... 427/77 |
| 2008/0206488 A1* | 8/2008 | Chung et al. ................. 427/596 |

FOREIGN PATENT DOCUMENTS

| JP | 3-290266 | 12/1991 |
| JP | 9-246688 | 9/1997 |
| JP | 2000-104006 | 4/2000 |
| JP | 2002-324966 | 11/2002 |
| JP | 2002-334618 | 11/2002 |
| JP | 2003-012964 | 1/2003 |
| JP | 2004-124237 | 4/2004 |
| JP | 2004-175832 | 6/2004 |
| JP | 2004-323887 | 11/2004 |
| JP | 2005-15608 | 1/2005 |
| JP | 2005-093380 | 4/2005 |
| JP | 2005-126505 | 5/2005 |
| JP | 2005-229109 | 8/2005 |
| JP | 2005-247905 | 9/2005 |
| JP | 2005-274549 | 10/2005 |
| JP | 2005-530005 | 10/2005 |
| JP | 2006-249399 | 9/2006 |
| WO | 03051562 | 6/2003 |

OTHER PUBLICATIONS

Chinese Patent Office issued a Chinese Office Action dated May 12, 2010, Application No. 200680040828.3.
JP Final Notice of Rejection dated Aug. 21, 2012, with English translation, Application No. 2006-242793.
Notice of Rejection dated May 22, 2012, with English translation; Application No. 2006-242793.

* cited by examiner

*Primary Examiner* — Mark Kopec
*Assistant Examiner* — Haidung Nguyen
(74) *Attorney, Agent, or Firm* — Young & Thompson

(57) ABSTRACT

A nickel ink having nickel particles dispersed in a dispersion medium is disclosed. The dispersion medium comprises one member or a combination of two or more members selected from the group consisting of an alcohol and a glycol both having a boiling point of 300° C. or lower at atmospheric pressure. The nickel particles have an average primary particle size of 50 nm or smaller. The nickel ink provides a conductor film with a surface smoothness having an average surface roughness Ra of 10 nm or smaller and a maximum surface roughness $R_{max}$ of 200 nm or smaller.

15 Claims, 1 Drawing Sheet

NICKEL INK AND CONDUCTOR FILM FORMED OF NICKEL INK

TECHNICAL FIELD

This invention relates to nickel ink and a process of producing the same. More particularly, this invention relates to a nickel ink that can be applied and solidified by, for example, inkjet printing to form a circuit pattern or the like with reduced surface roughness.

BACKGROUND ART

Circuit pattern formation using metal nanoparticles having a size of nanometer order is known, and a number of techniques have recently been proposed in which a circuit is drawn or printed directly on a variety of substrates using a conductive metal ink (a metal ink containing metal nanoparticles) by means of an inkjet printer or a dispenser, and the applied ink is fired to form conductor wiring or electrodes.

Circuit pattern formation on various substrates by firing metal nanoparticles at low temperature is exemplified by the proposal of JP 2002-334618A. Circuit formation by inkjet printing a conductive metal ink is disclosed in JP 2002-324966.

The technique in which a circuit pattern is directly printed on a substrate by inkjet printing or the like is attracting attention as a promising process allowing for great reduction of production cost because of a fewer number of steps involved and less waste from the steps than the generally spread, conventional circuit pattern forming technique utilizing photolithography. The conventional technique relying on photolithography is exemplified by the one disclosed in JP 9-246688A.

We have thus seen the technological changes from photolithographic techniques into inkjet printing or dispenser techniques, which have enabled more convenient and less expensive circuit formation on a substrate.

Nevertheless, the circuit formation technique using a conductive ink by inkjet printing or dispensing using a dispenser (hereinafter referred to as a dispenser method) has not been widespread primarily for the following reasons.

(i) The resulting conductor film lacks adhesion to various substrates, failing to fulfill fundamental characteristics required of a circuit board.
(ii) The resulting conductor film lacks surface smoothness. A circuit usually has a laminate structure including a base layer, so that it would have limited applicability in various respects unless the conductor film has sufficient surface smoothness. For is example, a different component layer provided on a rough surface of a conductor film would be influenced by the underlying surface roughness and fail to maintain good thickness uniformity.

The above-mentioned problem (i) is largely caused by the characteristics of a dispersion medium used in a conductive ink. It is considered that the adhesion of a conductor film formed by sintering and solidification to a substrate is governed by the chemical reaction between a binder component present in the dispersion medium and the substrate. The problem (ii) is believed to be caused by the characteristics of both the metal powder (metal particles) and the dispersion medium constituting a conductive ink. It is obvious that coarse metal particles make it impossible to form a conductor film with smooth surface. In addition to this, if the dispersion medium vigorously vaporizes and escapes from the inside of the conductor film during firing, it easily results in a failure to form a smooth film surface.

Thus, a conductor film formed by use of a conductive ink has been required to have good adhesion to various substrates and as smooth a surface as possible. A conductor film formed by using a nickel ink, in particular, has been required to have an average surface roughness (Ra) of 10 nm or smaller and a maximum surface roughness ($R_{max}$) of 200 nm or smaller in view of its application fields.

DISCLOSURE OF THE INVENTION

The present inventors have conducted extensive investigations to solve the above problems, contemplating use of nickel nanoparticles. They have found as a result that use of a nickel ink having the following characteristics provides a conductor film having good adhesion to various substrates, low electrical resistance, and a smooth surface with an average surface roughness (Ra) of 10 nm or smaller and a maximum surface roughness ($R_{max}$) of 200 nm or smaller.

The nickel ink contemplated by the present invention is a nickel ink composition having nickel particles dispersed in a dispersion medium. The dispersion medium comprises one member or a combination of two or more members selected from the group consisting of an alcohol and a glycol both having a boiling point of 300° C. or lower at atmospheric pressure. The nickel particles have an average primary particle size of 50 nm or smaller.

The nickel particles used in the nickel ink of the invention preferably have an average primary particle size of 10 to 30 nm to provide a conductor with improved surface smoothness.

The nickel ink of the invention preferably contains at least one coupling agent selected from the group consisting of a silane coupling agent, a titanium coupling agent, a zirconia coupling agent, and an aluminum coupling agent. The coupling agent is chosen as appropriate to the substrate.

The nickel ink of the invention preferably has a surface tension adjusted to be within a range of 15 to 50 mN/m.

The nickel ink of the invention preferably has a viscosity at 25° C. adjusted to be 60 cP or lower.

Using the nickel ink of the invention as described enables formation on various substrates a fired conductor film with an average surface roughness (Ra) of 10 nm or smaller and a maximum surface roughness ($R_{max}$) of 200 nm or smaller.

BEST MODE FOR CARRYING OUT THE INVENTION

Nickel Ink of Invention

Figure 1:
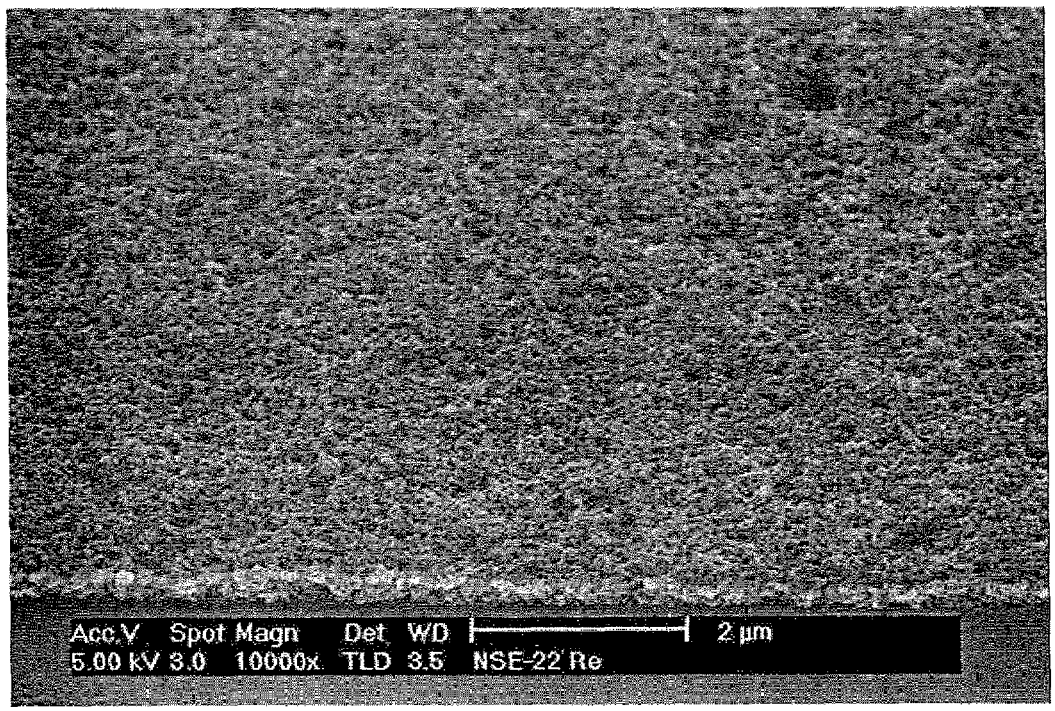
FIG. 1 is a scanning electron micrograph showing the surface condition of the conductor film obtained in Example 1.

As stated, the conductive ink of the invention is a nickel ink having nickel particles dispersed in a dispersion medium. The nickel ink of the invention is characterized in that the dispersion medium comprises one member or a combination of two or more members selected from the group consisting of an alcohol and a glycol both having a boiling point of 300° C. or lower at atmospheric pressure and that the nickel particles have an average primary particle size of 50 nm or smaller. As understandable from the basic composition described, the nickel ink is characterized by the nickel particles and dispersion medium used. The nickel ink is also characterized by allowing for easy control of printing precision in printing by various printing methods on a substrate on which a circuit is to be formed. Such easy control is achieved by adjusting the surface tension or viscosity of the ink according to the printing method employed. The nickel ink is also characterized in that the adhesion to a substrate material is adjustable, where necessary, by adding a coupling agent.

The characteristics of the nickel ink of the invention may be described from another aspect. There is a tendency that recent conductive inks have a complicated dispersion medium composition containing many other components in order to perform multiple functions. In contrast, the nickel ink of the invention is simple in composition as a whole owing to the use of a very simplified composition as a dispersion medium. Therefore, the nickel ink of the invention permits an appropriate choice of additives according to the printing technique adapted and the material of the substrate on which a nickel conductor is to be formed, whereby the above-mentioned problems are settled down.

Nickel Particles Used in Nickel Ink of Invention:

The nickel particles that can be used in the invention should have an average primary particle size of 50 nm or less in order to regulate the average surface roughness (Ra) and the maximum surface roughness ($R_{max}$) of the resulting conductor film to 10 nm or smaller and 200 nm or smaller, respectively. It is preferred for the nickel particles to have the following powder characteristics.

Taking application to an inkjet printing system or the like into consideration in the first place, it is preferred for the nickel particles to have an average primary particle size of not more than 600 nm. Ink particles having an average primary particle size exceeding 600 nm are extremely liable to cause the conductive ink to clog the inkjet nozzles, making continuous printing difficult. Even when the ink is printable, the formed wiring or electrode would be too thick to be made into desired fine circuitry. However, fulfillment of only this condition is not enough to achieve a desired level of surface smoothness of a conductor film formed of the nickel ink.

In order to reduce the surface roughness of a formed conductor film, appropriate choice and use of fine nickel particles with a proper primary particle size are needed. That is, the nickel particles should have an average primary particle size of 50 nm or less. Furthermore, in order to form a conductor film having a smooth surface with a surface roughness Ra of 10 nm or smaller, it is preferred that the average primary particle size of the nickel particles is within a range of 3 to 50 nm, more preferably from 3 to 30 nm. The reason of defining the lower limit of the average primary particle size at 3 nm is that a technology of producing a product having a smaller average primary particle size and yet exhibiting excellent dispersibility has not been established. This means that if a process of producing fine nickel particles having excellent dispersibility is established, the lower limit (3 nm) of the average primary particle size will be lowered further. On the other hand, use of particles with the average primary particle size greater than 50 nm is unfavorable, leading to a failure to provide a desired surface smoothness. The smaller the primary particle size of the nickel particles is, the smaller the Ra (indicative of conductor surface smoothness) tends to be. The terminology "primary particle size" as used herein refers to a particle size determined by observing particles under a scanning electron microscope, adding up the particle sizes of at least 200 particles in a field of view, and averaging out. In the case of spherical particles, the particle size means a diameter. In the case of needle-like particles, the particle size is a breadth (minor axis length). In the case of platy particles, the particle size is the length of a thickness direction. In the case of irregularly shaped particles, the particle size means the length of the shortest part of the particles.

The nickel particles' having a small average primary particle size provides a base for judging the nickel particles are fine particles. Nevertheless, fine particles in the conductive ink may agglomerate into greater secondary particles, which deteriorate the conductor surface smoothness. The range of secondary particle size within which the conductor surface may have an average surface roughness (Ra) of 10 nm or smaller was confirmed experimentally. As a result, it has been revealed that the conductor surface may have its surface profile controlled almost assuredly to have an average surface roughness (Ra) of 10 nm or smaller and a maximum surface roughness ($R_{max}$) of 200 nm or smaller as long as the maximum size of the agglomerates (secondary particles) of the nickel particles in the conductive ink is 0.45 µm or less. Moreover, when the maximum agglomerate size is 0.45 µm or less, clogging of an inkjet nozzle is almost assuredly prevented in inkjet printing. Confining the maximum agglomerate size to 0.45 µm or less can be implemented by, for example, removing coarse particles with a membrane filter having a pore size of 0.45 µm in the course of ink preparation. Accordingly, the term "maximum agglomerate size" as used herein is not an actual measurement value but the pore size of a membrane filter.

The nickel particles in the nickel ink of the invention have a spherical shape. Nickel particles surface-treated with oleic acid, stearic acid, etc. may be used unless such surface treatment accelerates nickel ink deterioration with time, deteriorates sintering characteristics, causes an increase of resistance of the resulting conductor film or brings about any other disadvantages.

The process of preparing nickel particles is not particularly restricted. For example, a reaction mixture containing a nickel salt, a polyol, and a noble metal catalyst is heated to a reaction temperature, at which the reaction mixture is maintained to is reduce the nickel ions, followed by replacement with an organic solvent to prepare a slurry containing nickel particles.

Examples of the nickel salt include nickel hydroxide, nickel sulfate, nickel chloride, nickel bromide, and nickel acetate. The nickel salt concentration in the reaction mixture is preferably 1 g/l to 100 g/l in terms of nickel.

The polyol is used to reduce nickel ions in the reaction mixture. Examples of the polyol include ethylene glycol, diethylene glycol, triethylene glycol, tetraethylene glycol, 1,2-propanediol, dipropylene glycol, 1,2-butanediol, 1,3-butanediol, 1,4-butanediol, 2,3-butanediol, and 1,5-pentanediol. The polyol concentration in the reaction mixture is preferably 11 to 1100 equivalents per nickel equivalent.

The noble metal catalyst is used to promote nickel ion reduction by polyol. Examples of the noble metal catalyst include palladium compounds such as palladium chloride, palladium nitrate, palladium acetate, and palladium ammonium chloride; silver compounds such as silver nitrate, silver lactate, silver oxide, silver sulfate, silver cyclohexane, and silver acetate; platinum compounds such as chloroplatinic acid, potassium chloroplatinate, and sodium chloroplatinate; and gold compounds such as chloroauric acid and sodium chloroaurate. The amount of the noble metal catalyst in the reaction mixture influences the rate of nickel ion reduction. Nickel particles tend to become coarse when the rate of reduction is low. Nickel particles tend to vary considerably in particle size when the rate of reduction is high. From these considerations, the concentration of the noble metal catalyst in the reaction mixture is preferably 0.01 to 0.5 mg/l.

The reaction mixture is prepared by, for example, putting a nickel salt, a polyol, and a noble metal catalyst into water, followed by stirring. In the case where the noble metal catalyst exists in the form of an aqueous solution like palladium nitrate, is the reaction mixture is prepared by mixing a nickel salt, a polyol, and the noble metal catalyst without water.

An amino acid is preferably added to the resulting reaction mixture. Addition of an amino acid facilitates obtaining nickel particles with a small primary particle size. The amino acid to be used is preferably one having a boiling or decomposition point at or above the reaction temperature and capable of forming a complex with nickel and a noble metal catalyst in a polyol. For example, L-alginine and L-cystine are preferably used. The amount of the amino acid to be added is preferably 0.01% to 20% by weight based on the nickel in the reaction mixture.

The reaction mixture is heated to a reaction temperature that causes nickel ions to be reduced. The reaction mixture is maintained at that temperature to carry out nickel ion reduction thereby to produce nickel particles. The reaction temperature is preferably 150° C. to 210° C. The reaction time is usually 1 to 20 hours.

Water of the reaction mixture in which nickel particles have been produced is replaced with an organic solvent to give a nickel slurry. Examples of the organic solvent include terpenes such as terpineol and dihydroterpineol, glycols such as ethylene glycol, and alcohols such as octanol and decanol.

Instead of preparing nickel particles by the above described process, commercially available nickel particles may be used. For example, nickel nanoparticles available from the common assignee under the trade name of NN-20 can be used. Nickel particles that can be used in the invention may also be prepared by the processes (a) to (f) described below.

(a) A dry reduction process in which a nickel compound powder is reduced with a reducing gas (see JP 2004-323887A).
(b) A wet reduction process in which a nickel salt solution or a nickel compound slurry is reduced with a reducing compound such as an amine or a hydrazine (see JP 2004-124237A and JP 2005-82818A).
(c) A microwave heating process in which a reducing solvent containing a nickel salt is irradiated with microwaves to reduce the nickel salt (see JP 2000-256707A).
(d) A spray pyrolysis process in which a nickel salt solution is atomized into fine droplets and pyrolyzed by heating (see JP 11-124602A).
(e) A chemical vapor deposition process in which a nickel salt is vaporized by heating and reduced with a reducing gas (see JP 2005-240075A).
(f) A physical vapor deposition process in which nickel is melted and evaporated by plasma and cooled into fine powder (see JP 2005-307229A).

The concentration of nickel particles in the nickel ink is preferably 2% to 76% by weight, more preferably 5% to 76% by weight, even more preferably 5% to 60% by weight.

Dispersion Medium of Nickel Ink:

The dispersion medium used in the conductive ink of the present invention is selected from those acting as a main solvent, a surface tension modifier, a viscosity modifier, or the like as described below. Depending on the kind of the dispersion medium, three or more compounds performing different functions selected from a main solvent a surface tension modifier, and a viscosity modifier may be used in combination, or when a compound serves for two or more of these functions, such a compound may be used alone or in combination with one more compound. In any case, the proportion of the sum of the compounds functioning as a main solvent, a surface tension modifier, and a viscosity modifier, namely, the proportion of the dispersion medium in the ink is preferably 20% to 95% by weight, more preferably 60% to 95% by weight.

An organic solvent is preferably used as a dispersion medium serving as a main solvent. Specifically, one member or a combination of two or more members selected from the group consisting of alcohols and glycols each having a boiling point of 300° C. or lower at atmospheric pressure is used. In the case where the dispersion medium comprises two or more organic solvents, the term "main solvent" does not always mean an organic solvent that forms a largest proportion of all the organic solvents. It is advisable not to use water as a dispersion medium, which does not mean that the ink of the invention is a water-free ink, though.

The limitation of the boiling point at atmospheric pressure to 300° C. or lower is based on the following reasons. In a boiling point range exceeding 300° C., when an electrode is to be formed, the solvent is gasified at high temperatures in the step of reducing firing, and the gas causes fine cracks or voids in the electrode, failing to form a dense electrode, only to form a conductor film which is not dense as a result and therefore has not only a poor adhesion to various substrates but also an increased electrical resistance of the conductor film.

In using alcohols as a main solvent, it is preferred to use at least one alcohol selected from 1-propanol, 1-butanol, 1-pentanol, 1-hexanol, cyclohexanol, 1-heptanol, 1-octanol, 1-nonanol, 1-decanol, glycidol, benzyl alcohol, methylcyclohexanol, 2-methyl-1-butanol, 3-methyl-2-butanol, 4-methyl-2-pentanol, isopropyl alcohol, 2-ethylbutanol, 2-ethylhexanol, 2-octanol, terpineol, dihydroterpineol, 2-methoxyethanol, 2-ethoxyethanol, 2-propoxyethanol, 2-n-butoxyethanol, 2-phenoxyethanol, carbitol, ethyl carbitol, n-butyl carbitol, diacetone alcohol, dimethyl carbitol, and diethyl carbitol. Particularly preferred of them are those having a boiling point of 80° to 300° C. at atmospheric pressure and difficulty vaporizable at atmospheric pressure at room temperature, such as 1-butanol, 1-octanol, terpineol, dihydroterpineol, 2-methoxyethanol, 2-ethoxyethanol, 2-n-butoxyethanol, and diacetone alcohol.

In using glycols as a main solvent, it is preferred to use at least one glycol selected from ethylene glycol, diethylene glycol, triethylene glycol, tetraethylene glycol, propylene glycol, trimethylene glycol, dipropylene glycol, tripropylene glycol, 1,2-butylene glycol, 1,3-butylene glycol, 1,4-butylene glycol, pentamethylene glycol, and hexylene glycol. Particularly preferred of them are those having a viscosity of 100 cP or lower at ambient temperature, including ethylene glycol, diethylene glycol, propylene glycol, 1,4-butylene glycol, and dipropylene glycol. When in using a glycol having too high a viscosity, the viscosity of the resulting ink may be difficult to adjust for application to, for example, inkjet printing.

The main solvent is preferably used in an amount of 6% to 90%, more preferably 30% to 90%, even more preferably 30% to 80%, by weight based on the ink.

The ink of the invention can contain other organic solvent as a dispersion medium in addition to the aforementioned main solvent. The other organic solvent is added primarily as a surface tension modifier or a viscosity modifier. Addition of an organic solvent serving as a surface tension modifier or a viscosity modifier helps to adjust the surface tension or viscosity of the ink within a range suited for inkjet printing. It is preferred for the other organic solvent used as a surface tension modifier or a viscosity modifier to be compatible with the main solvent. The details of the surface tension modifier and the viscosity modifier will be described later.

Agent for Improving Smoothness and Adhesion of Nickel Ink:

The nickel ink of the invention preferably contains at least one coupling agent selected from the group consisting of a silane coupling agent, a titanium coupling agent, a zirconia coupling agent, and an aluminum coupling agent. These coupling agents function to improve the surface smoothness of a conductor film formed of the nickel ink of the invention on a variety of substrates and to improve the adhesion of the conductor film to the substrates.

The coupling agents recited can be used either individually or as a combination of two or more thereof. A proper combination of the coupling agents makes it possible to adjust the adhesion of the conductor film as appropriate to the properties of the substrate on which circuitry or the like is to be formed and to control the surface roughness of the formed circuitry.

The amount of the coupling agent to be added is decided depending on the amount of the nickel particles in the ink. Specifically, the amount of the coupling agent is preferably such that the weight ratio of the coupling agent to the nickel particles is in the range of from 0.05 to 0.6, more preferably from 0.1 to 0.4. The amount of the coupling agent is also preferably such that the total amount of the coupling agent(s) and the nickel particles be in the range of from 5% to 80%, more preferably 5% to 40%, by weight based on the ink. By the addition of that amount of the coupling agent, the conductor film formed by firing the ink of the invention exhibits sufficiently improved adhesion to a substrate and surface smoothness as well as sufficiently increased electroconductivity. While the weight ratio of the coupling agent to nickel particles is as recited supra, the concentration of the coupling agent in the ink is preferably 0.2% to 60%, more preferably 1% to 60%, even more preferably 1% to 48%, by weight provided that the weight ratio to nickel particles falls within the recited range.

Examples of the silane coupling agent that can be used preferably in the invention include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryl-trimethoxysilane, 3-methacryloxypropylmethyldimethoxysilane, 3-methacryloxy-propyltrimethoxysilane, 3-methacryloxypropylmethyldiethoxysilane, 3-methacryloxy-propyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminotriethoxysilane, 3-triethoxysilyl-N-(1,3-dimethylbutylidene)propylamine, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloro-propyltrimethoxysilane, 3-mercaptopropylmethyldimethoxysilane, 3-mercaptopropyl-trimethoxysilane, bis(triethoxysilylpropyl) tetrasulfide, 3-isocyanatopropyltriethoxy-silane, tetramethoxysilane, tetraethoxysilane, methyltrimethoxysilane, methyltriethoxy-silane, dimethyltriethoxysilane, phenyltriethoxysilane, hexamethyldisilazane, hexyltrimethoxysilane, and decyltrimethoxysilane. To obtain stable adhesion to a substrate, preferred of them are those having stable performance properties such as methyltrimethoxysilane, methyltriethoxysilane, and dimethyltriethoxysilane. An oligomer or silicone having a plurality of the coupling agents polymerized via siloxane bonds may also be used.

Examples of the titanium coupling agent that can be used preferably include tetraisopropyl titanate, tetra(n-butyl) titanate, butyl titanate dimer, tetra(2-ethylhexyl) titanate, tetramethyl titanate, titanium acetylacetonate, titanium tetraacetylacetonate, titanium ethylacetoacetate, titanium octanediolate, titanium lactate, titanium triethanotaminate, and polyhydroxytitanium stearate. To obtain stable adhesion to a substrate, preferred of them are those having stable performance properties such as tetraisopropyl titanate, tetra(n-butyl) titanate, and titanium lactate.

Examples of the zirconium coupling agent that can be used preferably include zirconium n-propylate, zirconium n-butylate, zirconium tetraacetylacetonate, zirconium monoacetylacetonate, zirconium bisacetylacetonate, zirconium monoethylacetoacetate, zirconium acetylacetonate bisethylacetoacetate, zirconium acetate, and zirconium monostearate. To obtain stable adhesion to a substrate, preferred of them are those having stable performance properties such as zirconium n-propylate, zirconium n-butylate, zirconium tetraacetylacetonate, zirconium monoacetylacetonate, zirconium bisacetylacetonate, zirconium monoethylacetoacetate, zirconium acetylacetonato bisethylacetoacetate, and zirconium acetate.

Examples of the aluminum coupling agent that can be used preferably include aluminum isopropylate, mono-sec-butoxyaluminum diisopropylate, aluminum sec-butylate, aluminum ethylate, ethylacetoacetatoaluminum diisopropylate, aluminum tris(ethylacetoacetate), alkylacetoacetatealuminum diisopropylates, aluminum monoacetylacetonate bis(ethylacetoacetate), aluminum tris(acetylacetonate), aluminum monoisopropoxymonooleoxyethylacetoacetate, cyclic aluminum oxide isopropylate, cyclic aluminum oxide octylate, and cyclic aluminum oxide stearate. To obtain stable adhesion to a substrate, preferred of them are those having stable performance properties such as ethylacetoacetatoaluminum diisopropylate, aluminum tris(ethylacetoacetate), alkylacetoacetatoaluminum diisopropylates, aluminum monoacetylacetonate bis(ethylacetoacetate), and aluminum tris(acetylacetonate).

Surface Tension of Nickel Ink:

The nickel ink of the present invention preferably has its surface tension at 25° C. adjusted to be in the range of 15 to 50 mN/m, more preferably 20 to 40 mN/m. The nickel ink with so adjusted the surface tension is easily applicable to a substrate to form circuitry or the like even when applied for example by the inkjet printing method or the dispenser method. The nickel ink the surface tension of which is out of the recited preferred range can fail to be ejected from a nozzle particularly when applied by inkjet printing. Even when the ink succeeds in being ejected from a nozzle, problems can occur such as ink drop misplacement and inability to print continuously. In the present invention, successful formation of fine circuitry by use of an inkjet printer can thus be made feasible by adjusting the surface tension of the nickel ink within the specific range well suited for inkjet printing.

Surface Tension Adjustment:

To adjust the ink surface tension, it is preferred to use for example an additive (hereinafter called a surface tension modifier) having a surface tension of 20 to 45 mN/m at 25° C. Using a surface tension modifier having the recited surface tension is the easiest method for adjusting the ink surface tension to make the ink suited to be printed by various printing techniques including inkjet printing and the dispenser method, thereby enabling formation of a fine circuit pattern. It is preferred to use as a surface tension modifier one or more of alcohols, glycols, ethers, and ketones all having a boiling point of 100° C. to 300° C. at atmospheric pressure and a surface tension of 20 to 45 mN/m at 25° C. Some of the main solvents described supra also serve the function as a surface tension modifier, in which case there is no need to add a separate surface tension modifier. Furthermore, some of viscosity modifiers described later also serve the function as a surface tension modifier, in which case, too, no separate surface tension modifier is necessary.

Examples of the alcohols having a surface tension of 20 to 45 mN/m at 25° C. include 1-butanol, 1-pentanol, 1-hexanol, 1-octanol, 4-methyl-2-pentanol, 2-methoxyethanol, 2-ethoxyethanol, 2-propoxyethanol, 2-n-butoxyethanol, methyl carbitol, ethyl carbitol, dimethyl carbitol, diethyl carbitol, and n-butyl carbitol. Examples of the glycols having a surface tension of 20 to 45 mN/m at 25° C. include propylene glycol and dipropylene glycol. Examples of the ethers include 1,4-dioxane, γ-butyrolactone, and di-n-butyl ether. Examples of the ketones having a surface tension of 20 to 45 mN/m at 25° C. include acetylacetone, diacetone alcohol, and 2-heptanone. To secure long-term quality stability as nickel ink, it is preferred to use 2-n-butoxyethanol or 2-ethoxyethanol as a surface tension modifier.

The amount of the surface tension modifier to be added is decided relative to the amount of the main solvent. Specifically, the amount of the surface tension modifier is preferably such that the surface tension modifier to main solvent weight ratio is in the range of from 0.1 to 1.2, more preferably from 0.1 to 0.5. The concentration of the surface tension modifier in the ink is preferably 0.8% to 80%, more preferably 4% to 80%, even more preferably 5% to 50%, by weight provided that the weight ratio recited above is met. A surface tension modifier concentration below 0.8% by weight may be insufficient to achieve effective surface tension adjustment. Addition of more than 80% by weight surface tension modifier is liable to cause a considerable change of disperse state of the nickel particles in the ink, compared with the state before addition of the surface tension modifier, and it can follow that the nickel particles begin agglomerating and lose uniform disperse state, the most important factor for nickel ink.

Viscosity of Nickel Ink:

In the present invention, it is possible to adjust the viscosity of the nickel ink in accordance with the printing technique adopted. It is preferred for the nickel ink to have a viscosity of 60 cP or lower, more preferably 30 cP or lower, at 25° C. so as to facilitate circuit formation or the like particularly by the inkjet or dispenser method in which printing accuracy is dependent on the viscosity of the ink. There is no particular lower limit of the viscosity because the sizes and shapes of wires and electrodes to be formed vary depending on the place and purpose of circuit formation. When the nickel ink is printed by the inkjet method or the dispenser method in formation of fine wires and electrodes, if the ink viscosity exceeds 60 cP at 25° C., the ink can encounter difficulty in being ejected from a nozzle stably due to its higher viscosity than the energy for ejecting ink droplets from the nozzle. The present inventors have confirmed through their experimentation that formation of fine wires and electrodes can be accomplished by the inkjet method or the dispenser method as long as the ink viscosity is 60 cp or lower at 25° C.

Viscosity Adjustment:

To adjust the ink viscosity, it is preferred to use an additive (hereinafter called a viscosity modifier) comprising one member or a combination of two or more members selected from the group consisting of alcohols, terpenes, ethers, and ketones all having a boiling point of 100° C. to 300° C. at atmospheric pressure. Some of the main solvents described supra also serve the function as a viscosity modifier, in which case there is no need to add a viscosity modifier separately. Furthermore, some of surface tension modifiers described supra also serve the function as a viscosity modifier, in which case, too, no separate viscosity modifier is necessary.

Examples of the alcohols having a boiling point of 100° to 300° C. at atmospheric pressure include 1-pentanol, 2-pentanol, 2-methyl-2-butanol, 3-methyl-1-butanol, isobutyl alcohol, undecanol, 2-ethylbutanol, 2-ethylhexanol, 2-octanol, 1-octanol, glycidol, cyclohexanol, 3,5-dimethyl-1-hexyn-3-ol, 1-decanol, tetrahydrofurfuryl alcohol, terpineol, neopentyl alcohol, 1-nonanol, 1-butanol, furfuryl alcohol, propargyl alcohol, 1-hexanol, 1-heptanol, 2-heptanol, 3-heptanol, benzyl alcohol, 3-pentanol, methylcyclohexanol, 2-methyl-1-butanol, 3-methyl-2-butanol, 3-methyl-1-butyn-3-ol, 4-methyl-2-pentanol, 3-methyl-1-pentyn-3-ol, ethylene glycol, ethylene glycol monoacetate, 2-isopropoxyethanol, 2-ethoxyethanol, 2-phenoxyethanol, 2-butoxyethanol, ethylene glycol monohexyl ether, 2-methoxyethanol, 2-chloroethanol, 1,3-octanediol, glycerol, glycerol 1,3-diacetate, glycerol dialkyl ethers, glycerol monoacetate, glycerol chlorohydrin, 3-chloro-1,2-propanediol, diethylene glycol, 2-(2-chloroethanoxy)ethanol, 2-(2-ethoxyethoxy)ethanol, butyl carbitol, methyl carbitol, cyclohexanediol, dipropylene glycol, dipropylene glycol monoethyl ether, dipropylene glycol monobutyl ether, dipropylene glycol monopropyl ether, dipropylene glycol monomethyl ether, tetraethylene glycol, triethylene glycol, triethylene glycol monoethyl ether, triethylene glycol monomethyl ether, tripropylene glycol, tripropylene glycol monomethyl ether, 1,3-propanediol, trimethylolethane, trimethylolpropane, 1,2-butanediol, 1,3-buanediol, 1,4-butanediol, 1,4-butenediol, propylene glycol, 1-ethoxy-2-propanol, 1-butoxy-2-propanol, 1-methoxy-2-propanol, chloropropanol, hexylene glycol, pentaerythritol, 1,5-pentanediol, polyethylene glycol, and 2-methoxymethoxyethanol.

Examples of the terpenes having a boiling point of 100° C. to 300° C. at atmospheric pressure include terpineol and dihydroterpineol.

Examples of the ethers having a boiling point of 100° C. to 300° C. at atmospheric pressure include anisole, ethyl isoamyl ether, ethyl benzyl ether, epichlorohydrin, cresyl methyl ether, isopentyl ether, acetal, dioxane, cineol, phenyl ether, butyl ether, benzyl ether, trioxane, dichloroethyl ether, phenetol, butyl phenyl ether, furfural, monochlorodiethyl ether, 1,2-diethoxyethane, ethylene glycol diglycidyl ether, 1,2-dibutoxyethane, 2-ethoxyethyl-2-methoxyethyl ether, diethyl carbitol, dibutyl carbitol, diethylene glycol dimethyl ether, triethylene glycol dimethyl ether, triglycol dichloride, and γ-butyrolactone.

Examples of the ketones having a boiling point of 100° C. to 300° C. at atmospheric pressure include acetylacetone, acetophenone, isophorone, ethyl butyl ketone, diacetone alcohol, diisobutyl ketone, diisopropyl ketone, 3-pentanone, cyclohexanone, 4-heptanone, phorone, methyl oxide, 2-heptanone, methyl isobutyl ketone, methylcyclohexanone, 2-hexanone, 2-pentanone, 2-octanone, and 2-nonanone.

Preferred of them are dioxane and γ-butyrolactone in view of ink quality stability.

The amount of the viscosity modifier to be added is decided relative to the is amount of the main solvent. Specifically, the amount of the viscosity modifier is preferably such that the viscosity modifier to main solvent weight ratio be in the range of from 0.1 to 1.2, more preferably from 0.5 to 1.2. The concentration of the viscosity modifier in the ink is preferably 0.8% to 80%, more preferably 4% to 80%, even more preferably 4% to 50%, by weight provided that the weight ratio recited above is met.

Preparation of Nickel Ink of Invention:

The method of preparing the above-described nickel ink is not particularly restricted. Any method can be employed as long as at least the nickel particles and the dispersion medium are uniformly dispersed in the final product. It is advisable, nevertheless, to carry out multi-stage dispersing operation for sufficiently improving particle dispersibility prior to the ink preparation as follows.

To begin with, the nickel particles and the dispersion medium are mixed to prepare a mother nickel slurry. The mother nickel slurry is dispersed in a disperser and passed through a filter such as a membrane filter to remove agglomerates of the primary nickel particles. The concentration of the slurry is then adjusted by means of a centrifugal separator. Various additives are added to the slurry, followed by mixing thoroughly to give a desired nickel ink.

The ink thus obtained is applied to a variety of substrates such as glass, indium tin oxide (ITO), silver, copper, and silicon by inkjet printing or with a dispenser. The ink film applied is fired preferably at 150° C. to 950° C., more preferably at 200° C. to 400° C. The firing atmosphere is not limited but preferably a nitrogen atmosphere, an argon atmosphere, or a hydrogen/nitrogen mixed atmosphere and so on. In the case of using a hydrogen/nitrogen mixed atmosphere, the hydrogen concentration is preferably about 1 to 4% by volume. In any firing atmosphere, the firing time is suitably about 0.5 to 2 hours.

As described in detail, the nickel ink of the present invention is suitable for the formation of fine and precise wires and electrodes by the dispenser method or the inkjet printing method. The nickel ink of the invention exhibits good adhesion to various substrates and to circuitry or the like formed of a different element. The nickel ink of the invention forms a conductor film with a smooth surface (an average surface roughness Ra of 10 nm or smaller and a maximum surface roughness $R_{max}$ of 200 nm or smaller). Therefore, the nickel ink is suited for the formation of thin nickel electrodes or wires on a variety of substrates such as glass, ITO, silver, copper, and silicon.

EXAMPLES

The present invention will now be illustrated in greater detail with reference to Examples, but it should be understood that the invention is not construed as being limited thereto.

Example 1

A nickel ink was prepared by the steps described below. The resulting ink was tested for inkjet printability. A conductor film was formed using the ink and evaluated for resistivity, adhesion, and electrode surface smoothness.

(1) Preparation of Nickel Slurry

Fifty grams of nickel particles (NN-20 available from Mitsui Mining & Smelting Co., Ltd.; spherical; average primary particle size: 20 nm) and 950 g of ethylene glycol as a dispersion medium were mixed to prepare 1000 g of a mother nickel slurry.

(2) First Dispersing Step

The nickel slurry was dispersed in a paint shaker (from Asada Works, Co., Ltd.) using zirconia beads (from Nikkato Corp.; diameter: 0.1 mm) as a medium for 30 minutes.

(3) Second Dispersing Step

The nickel slurry was further dispersed in a high-speed dispersing emulsifier (T.K. Filmix from Tokushu Kika Kogyo Co., Ltd.) to give a nickel slurry having nickel particles dispersed therein.

(4) Removal of Agglomerates

Agglomerates in the slurry were removed by passing the slurry through a membrane filter (from Advantec Toyo Kaisha, Ltd.; pore size: 0.45 µm) to give a nickel slurry free from coarse particles.

(5) Concentration Adjustment

The nickel slurry was centrifuged to adjust the nickel concentration to 17.9 wt % and again dispersed in T.K. Filmix (from Tokushu Kika Kogyo Co., Ltd.) to give a nickel slurry with the adjusted concentration.

(6) Preparation of Conductive Ink

To 100 g of the nickel slurry were added 7.2 g of a silane coupling agent (KBE-603 from Shin-Etsu Silicones), 36.0 g of γ-butyrolactone (from Wako Pure Chemical Ind., Ltd.) as a viscosity modifier, and 36.0 g of 2-ethoxyethanol (from Wako Pure Chemical Ind., Ltd.) as a surface tension modifier, and the mixture was dispersed in T.K. Filmix (from Tokushu Kika Kogyo Co., Ltd.) to give conductive ink A.

(7) Evaluation of Printability

Conductive ink A had a viscosity of 24 cP at 25° C. as measured with a viscometer (VM-100A from Yamaichi Electronics Co., Ltd.) and a surface tension of 35 mN/m at 25° C. as measured with a surface tensiometer (DCW-100W from A & D Co., Ltd.). A wiring pattern (line-and-space: 100 µm; length: 2 cm) was printed on an alkali-free glass substrate (OA-10 from Nippon Electric Glass Co., Ltd.) with conductive ink A using a commercially available inkjet printer (PM-G700 from Seiko Epson). Conductive ink A was successfully printed causing no clogging of the inkjet nozzle even when the printing was repeated 100 times and when printing was resumed after 1 hour suspension. The wiring pattern was found satisfactory with neither breaking nor ink splash as observed under an optical microscope.

(8) Making of Conductor Film

Conductive ink A was applied to an alkali-free glass substrate (OA-10 from Nippon Electric Glass Co., Ltd.) with a spin coater (from Mikasa Co., Ltd.) at 1000 rpm for 10 seconds, dried by heating at 100° C. for 10 minutes in the atmosphere, and fired at 300° C. for 1 hour in a hydrogen/nitrogen mixed atmosphere having a hydrogen content of 1% by volume to form conductor film A.

(9) Evaluation of Electroconductivity

A cross-section of the conductor film A was observed under a scanning electron microscope (FE-SEM from FEI Company). The film thickness was 400 nm. The conductor film A had a specific resistance of $2.0 \times 10^{-3}$ Ω·cm as measured with a four-probe resistivity measuring device (Lorest GP from Mitsubishi Chemical Corp.).

(10) Evaluation of Adhesion

The adhesion of the conductor film A to the glass substrate was evaluated by the cross-cut test specified in JIS K5600-5-6. As a result, the adhesion was rated as classification 0, indicating high adhesion. No peeling of the conductor film A was observed under a microscope even after ultrasonic cleaning in water for 10 minutes and then in acetone for 10 minutes.

(11) Evaluation of Surface Smoothness

Observation of a cross-section of the conductor film A with a scanning electron microscope (FE-SEM from FEI Company) revealed a smooth surface. As a result of measurement of the film surface roughness with a profilometer (Surfcom 130A from Tokyo Seimitsu Co., Ltd.), Ra was 9 nm, and $R_{max}$ was 70 nm. The scanning electron micrograph of the cross-section of the conductor film A is presented in FIG. 1.

Example 2

Fifty grams of nickel particles (NN-20 from Mitsui Mining & Smelting Co., Ltd.; spherical; average primary particle size: 20 nm) and 950 g of 1-pentanol as a dispersion medium were mixed to prepare 1000 g of a mother nickel slurry. The mother nickel slurry was treated in the same manner as in Example 1 to prepare a nickel slurry having a nickel concentration adjusted to 17.9 wt %.

To 100 g of the resulting nickel slurry was added 7.7 g of a titanium coupling agent (Orgatics TC-401 from Matsumoto Trading Co., Ltd.), and the mixture was dispersed in T.K. Filmix (from Tokushu Kika Kogyo Co., Ltd.) to give conductive ink B.

Inkjet printability of the resulting conductive ink B was confirmed in the same manner as in Example 1. A conductor film was formed using conductive ink B and evaluated for resistivity and electrode surface smoothness in the same manner as in Example 1. As a result, conductive ink B had a viscosity and a surface tension of 13 cP and 25 mN/m at 25° C., respectively. Conductive ink B was printable without causing inkjet nozzle clogging. A conductor film formed of conductive ink B (thickness: 400 nm) had a specific resistance of $3.1 \times 10^{-3}$ Ω·cm, which was as low as that of the conductor film formed in Example 1. The conductor film had an Ra of 9 nm and an $R_{max}$ of 93 nm, indicating satisfactory surface smoothness.

Comparative Example 1

A nickel slurry was prepared in the same manner as in Example 1, except for replacing ethylene glycol with 950 g of water as a dispersion medium. However, the dispersed nickel particles did not pass through a membrane filter having a pore size of 0.45 μm because of the size of the particles was too large, resulting in a failure to provide a conductive ink.

Comparative Example 2

Figure 2:
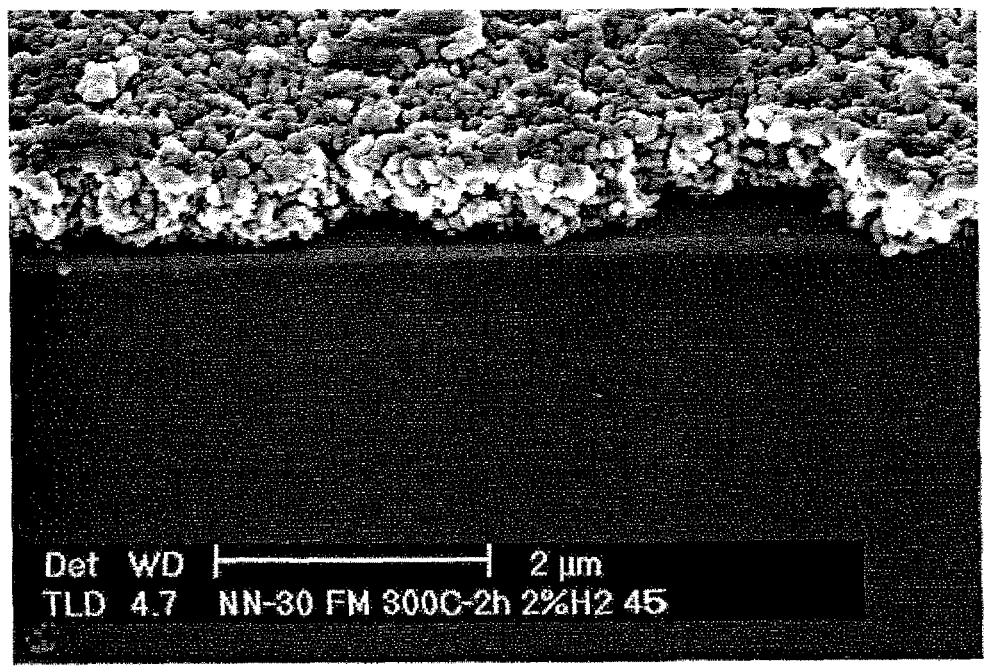
FIG. 2 is a scanning electron micrograph showing the surface condition of the conductor film obtained in Comparative Example 2.

A nickel ink designated conductive ink C was prepared in the same manner as in Example 1, except for using nickel particles having an average primary particle size of 100 nm (NN-100 from Mitsui Mining & Smelting Co., Ltd.; spherical). Inkjet printability of the resulting conductive ink C was confirmed in the same manner as in Example 1. A conductor film was formed using conductive ink C and evaluated for resistivity and electrode surface smoothness in the same manner as in Example 1. As a result, conductive ink C had a viscosity and a surface tension of 19 cP and 33 mN/m, respectively at 25° C. Conductive ink C was printable without causing inkjet nozzle clogging. However, a conductor film formed of conductive ink C (thickness: 500 nm) had a specific resistance of $5.3 \times 10^{-3}$ Ω·cm, which was higher than that of the conductor film formed in Example 1. The conductor film had an Ra of 48 nm and an $R_{max}$ of 320 nm, indicating poor surface smoothness. A scanning electron micrograph of a cross-section of the conductor film is presented in FIG. 2.

Industrial Applicability

The nickel ink of the invention is primarily characterized by its ability to form a conductor film with a smooth surface having an average roughness Ra of 10 nm or smaller and a maximum roughness $R_{max}$ of 200 nm or smaller. A conductor film formed of the nickel ink of the invention has high adhesion to various substrates and a high density, enabling formation of a high-quality and low-resistance conductor circuit. Containing unprecedented nickel nanoparticles, the nickel ink of the invention is suited for forming fine wires and electrodes on a substrate by an inkjet method or a dispenser method.

The nickel ink of the invention can have its adhesion adjusted according to the material of a variety of substrate and is able to form fine wires and electrodes. For example, it is suited for a direct-write of a circuit on a variety of substrates, a nickel electrode on a copper or silver wire, a nickel electrode on an ITO transparent electrode, a protective nickel circuit, a protective nickel film, and the like. Accordingly, the nickel ink of the invention has wide applicability to various electronic industrial fields represented by flat display panels.

The invention claimed is:

1. An ink comprising:
   a dispersion medium,
   a coupling agent, and
   metallic particles consisting of nickel particles,
   the dispersion medium comprising a main solvent, a surface tension modifier and a viscosity modifier, wherein:
   the main solvent consists essentially of a glycol having a boiling point of 300° C. or lower at atmospheric pressure, and a viscosity of 100 cP or lower at ambient temperature,
   the surface tension modifier consists essentially of an alcohol having a boiling point of 100° C. to 300° C. at atmospheric pressure and a surface tension of 20 to 34 mN/m at 25° C.,
   the viscosity modifier consists essentially of a ketone having a boiling point of 100° C. to 300° C. at atmospheric pressure, and
   a weight ratio of the surface tension modifier to the main solvent is in a range of 0.1 to 0.5 and a weight ratio of the viscosity modifier to the main solvent is in the range of 0.1 to 1.2,
   the coupling agent comprises one member or a combination of two or more members selected from the group consisting of a silane coupling agent, a titanium coupling agent, a zirconia coupling agent and an aluminum coupling agent,
   the metallic particles consisting of nickel particles have an average primary particle size of 50 nm or smaller,
   the weight ratio of the coupling agent to the nickel particles is in a range of from 0.05 to 0.6, and
   the ink has a surface tension in a range of 15 to 50 mN/m and a viscosity at 25° C. of 60 cP or lower such that the ink is used for inkjet printing.

2. The ink according to claim 1, wherein the nickel particles have an average primary particle size of 10 to 30 nm.

3. The ink according to claim 1, wherein the nickel particles are prepared by heating a reaction mixture comprising a nickel salt, a polyol and a noble metal catalyst, the mixture being heated to a reaction temperature that reduces nickel ions.

4. The ink according to claim 1, wherein a total amount of the coupling agent and the nickel particles is in a range of from 5% to 40% by weight of the ink.

5. The ink according to claim 1, wherein a concentration of the coupling agent in the ink is in a range of from 1% to 48% by weight.

6. An ink comprising:
   a dispersion medium,
   a coupling agent, and
   metallic particles consisting essentially of nickel particles,
   the dispersion medium comprising a main solvent, a surface tension modifier and a viscosity modifier, wherein:
   the main solvent consists essentially of a glycol having a boiling point of 300° C. or lower at atmospheric pressure, and a viscosity of 100 cP or lower at ambient temperature, the surface tension modifier consists essentially of an alcohol having a boiling point of 100° C. to 300° C. at atmospheric pressure and a surface tension of 20 to 34 mN/m at 25° C., the viscosity modifier consists essentially of a ketone having a boiling point of 100° C. to 300° C. at atmospheric pressure, and a weight ratio of the surface tension modifier to the main solvent is in a range of 0.1 to 0.5 and a weight ratio of the viscosity modifier to the main solvent is in the range of 0.1 to 1.2, the coupling agent comprises one member or a combination of two or more members selected from the group consisting of a silane coupling agent, a titanium coupling agent, a zirconia coupling agent and an aluminum coupling agent, the nickel particles have an average primary particle size of 50 nm or smaller, the weight ratio of the coupling agent to the nickel particles is in a range of from 0.05 to 0.6, and the ink has a surface tension in a range of 15 to 50 mN/m and a viscosity at 25° C. of 60 cP or lower such that the ink is used for inkjet printing.

7. The ink according to claim 6, wherein the nickel particles have an average primary particle size of 10 to 30 nm.

8. The ink according to claim 6, wherein the nickel particles are prepared by heating a reaction mixture comprising a nickel salt, a polyol and a noble metal catalyst, the mixture being heated to a reaction temperature that reduces nickel ions.

9. The ink according to claim 6, wherein a total amount of the coupling agent and the nickel particles is in a range of from 5% to 40% by weight of the ink.

10. The ink according to claim 6, wherein a concentration of the coupling agent in the ink is in a range of from 1% to 48% by weight.

11. An ink comprising:
a dispersion medium,
a coupling agent, and
nickel particles,
the dispersion medium comprising a main solvent, a surface tension modifier and a viscosity modifier, wherein:

the main solvent consists essentially of a glycol having a boiling point of 300° C. or lower at atmospheric pressure, and a viscosity of 100 cP or lower at ambient temperature, the surface tension modifier consists essentially of an alcohol having a boiling point of 100° C. to 300° C. at atmospheric pressure and a surface tension of 20 to 34 mN/m at 25° C., the viscosity modifier consists essentially of a ketone having a boiling point of 100° C. to 300° C. at atmospheric pressure, and a weight ratio of the surface tension modifier to the main solvent is in a range of 0.1 to 0.5 and a weight ratio of the viscosity modifier to the main solvent is in the range of 0.1 to 1.2, the coupling agent comprises one member or a combination of two or more members selected from the group consisting of a silane coupling agent, a titanium coupling agent, a zirconia coupling agent and an aluminum coupling agent, the nickel particles have an average primary particle size of 50 nm or smaller, the weight ratio of the coupling agent to the nickel particles is in a range of from 0.05 to 0.6, and the ink has a surface tension in a range of 15 to 50 mN/m and a viscosity at 25° C. of 60 cP or lower such that the ink is used for inkjet printing.

12. The ink according to claim 11, wherein the nickel particles have an average primary particle size of 10 to 30 nm.

13. The ink according to claim 11, wherein the nickel particles are prepared by heating a reaction mixture comprising a nickel salt, a polyol and a noble metal catalyst, the mixture being heated to a reaction temperature that reduces nickel ions.

14. The ink according to claim 11, wherein a total amount of the coupling agent and the nickel particles is in a range of from 5% to 40% by weight of the ink.

15. The ink according to claim 11, wherein a concentration of the coupling agent in the ink is in a range of from 1% to 48% by weight.

* * * * *

UNITED STATES PATENT AND TRADEMARK OFFICE
CERTIFICATE OF CORRECTION

PATENT NO. : 8,486,306 B2
APPLICATION NO. : 12/092584
DATED : July 16, 2013
INVENTOR(S) : Kamikoriyama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 317 days.

Signed and Sealed this
Eighth Day of September, 2015

Michelle K. Lee
*Director of the United States Patent and Trademark Office*